(12) United States Patent
Watanabe et al.

(10) Patent No.: US 7,244,343 B2
(45) Date of Patent: Jul. 17, 2007

(54) SPUTTERING APPARATUS

(75) Inventors: Kiyomi Watanabe, Kashiwa (JP);
Kiyoshi Komatsu, Tokyo (JP); Kazuo Sakai, Tokyo (JP); Hiroyuki Ikoshi, Tokyo (JP); Tetsuya Matsumoto, Niiza (JP); Toshio Kobayashi, Tokyo (JP); Tadashi Masuda, Tokyo (JP)

(73) Assignee: Origin Electric Company Limited, Tokyo (JP)

( * ) Notice: Subject to any disclaimer, the term of this patent is extended or adjusted under 35 U.S.C. 154(b) by 86 days.

(21) Appl. No.: 10/651,613

(22) Filed: Aug. 28, 2003

(65) Prior Publication Data
US 2005/0045475 A1    Mar. 3, 2005

(51) Int. Cl.
*C23C 14/34*    (2006.01)
(52) U.S. Cl. .............................. 204/298.08; 204/298.06
(58) Field of Classification Search .......... 204/298.08, 204/298.06, 192.12
See application file for complete search history.

(56) References Cited

U.S. PATENT DOCUMENTS

| | | | | |
|---|---|---|---|---|
| 4,560,831 A | * | 12/1985 | Bast et al. | 379/454 |
| 6,130,831 A | * | 10/2000 | Matsunaga | 363/98 |
| 6,760,234 B2 | * | 7/2004 | Yuzurihara et al. | 363/16 |

* cited by examiner

*Primary Examiner*—Rodney G. McDonald
(74) *Attorney, Agent, or Firm*—Kolisch Hartwell, P.C.

(57) ABSTRACT

A sputtering apparatus is provided with a DC power supply 1, an inverter 2 that converts DC voltage to AC voltage, a matching circuit 10 that transforms the AC voltage, a rectifier 4 that converts the transformed AC voltage to direct current, and a sputtering load 6. The matching circuit 10 has a transformer 3 that transforms AC voltage from the inverter 2, inductance L provided in series with at least one of the primary winding 31 and secondary winding 32, and a condenser C provided in parallel with at least one of the primary winding 31 and secondary winding 32 through inductance L.

14 Claims, 8 Drawing Sheets

SPUTTERING APPARATUS

BACKGROUND OF THE INVENTION

1. Field of the Invention

The present invention relates to a sputtering apparatus for supplying substantially constant DC power to a sputtering load having impedance that varies over a wide range.

2. Description of Related Art

This type of DC sputtering apparatus is used, for example, as a thin-film forming device, in which case an inert gas such as argon is introduced into a vacuum chamber and a negative voltage of several hundred volts is impressed on a target electrode made of aluminum, copper, or titanium to generate a plasma discharge. The plasma discharge positively ionizes the inert gas, and the positive ions are then accelerated toward and collide with the surface of a target. This causes the target material to be vaporized, with the vaporized material being deposited on the substrates of, for example, semiconductor surfaces and optical disks, to form a thin film comprising the target material on the substrates.

In this way, in a sputtering apparatus that generates a plasma discharge in a gas (or vacuum) from a relatively low voltage, the sputtering voltage changes significantly depending on the target material and type of introduced gas. For example, a typical sputtering voltage changes from 500 V to 1,000 V, a nearly twofold voltage range, with the same rated power required at each voltage within the range. That is, while the impedance of the sputtering load varies over a fourfold range, constant power must be supplied to the sputtering load whose impedance varies over this wide range.

Figure 7:
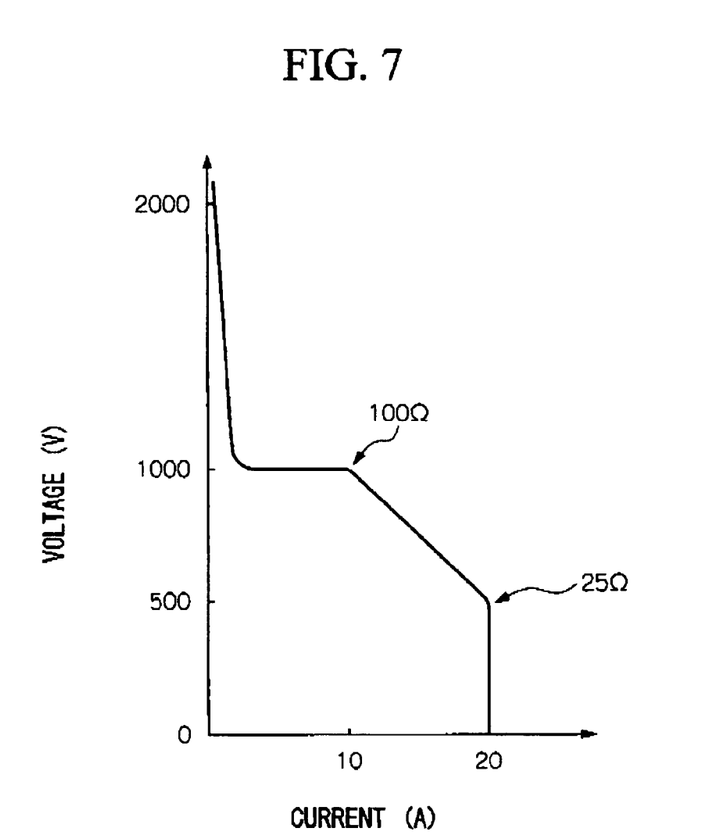
FIG. 7 is a graph showing the output voltage and current required for the sputtering apparatus.

FIG. 7 shows an ideal case of the output characteristics for a 10 kW sputtering apparatus whose load impedance quadruples from 25 Ω to 100 Ω. With a rated voltage of 1,000 V, the current available to a negative load of 100 Ω is 10 A, and with a voltage of 500 V, a 20 A current can be supplied to a negative load of 25 Ω. FIG. 7 also shows that this type of device requires a rise in the voltage for a current near zero. This is due to the need to apply an initial trigger voltage of at least 1.5 times the rated voltage in order to start the plasma discharge in the sputtering apparatus.

However, in the design of a normal power supply device that delivers 1,000 V×10 A of power, the maximum current available at 500 V is also around 10 A, even allowing for small discrepancies arising from the circuit configuration. For this reason it is necessary to design a large capacity power supply device that delivers 1,000 V×20 A of power in order to supply 10 kW at both 1,000 V and 500 V. However, a converter designed for excessively high power increases the reactive current of the converter circuit, thereby generating significant loss.

Figure 8:
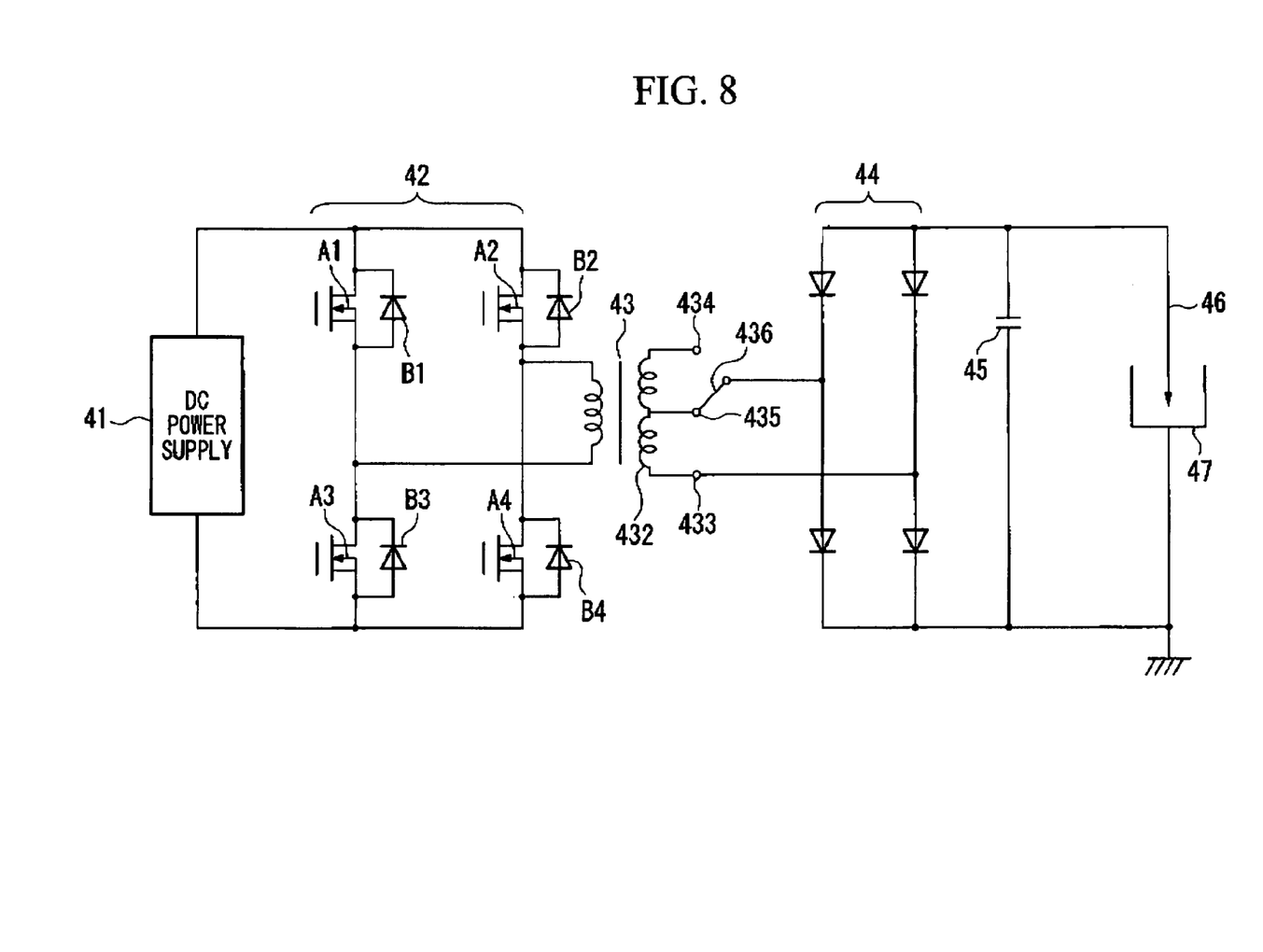
FIG. 8 is a circuit diagram showing an example of a conventional sputtering apparatus.

FIG. 8 shows an example of a conventional DC sputtering apparatus. DC power supply 41 is provided with, for example, a three-phase bridge rectifier that rectifies a three-phase AC power supply. The DC voltage is then converted to a high frequency AC voltage by inverter 42. This high frequency AC voltage is converted to the appropriate voltage for sputtering by transformer 43. Secondary winding 432 of the transformer 43 is provided with center tap 435 in addition to end taps 433, 434, with taps 434 and 435 switchable by tap switch 436 depending on the required voltage. Connection to the center tap 435 is shown in the drawing. The AC voltage from the selected tap is input to the AC input terminal of bridge rectifying circuit 44, which converts the transformed high frequency voltage to DC voltage. Filter condenser 45 then supplies a negative electrode voltage with reduced ripple voltage to sputtering load 46. Housing 47 of the sputtering load 46 is connected to the positive electrode side of the rectifying circuit 44 and grounded Transformer 43 is provided with a function that insulates the commercial power source polarity and the sputtering load 46.

In such a conventional sputtering apparatus, either tap 434 or 435 is selected in advance depending on the impedance level of the anticipated sputtering load in accordance with the gas introduced to the sputtering load 46 and the target material. For example, for materials with a low impedance load not exceeding 600 V, the center tap 435 is selected, while when a high impedance load of around 900 V is expected with a change in film forming conditions, the end tap 434 is selected, as shown in the figure.

However, the rise in the gas temperature following the onset of discharge alters the impedance of the sputtering load 46 and the voltage changes. When a tap not matching the changed impedance is selected, a problem arises in that the voltage enters a range in which the rated power is not attained, thereby inhibiting the specified sputtering process.

In addition, switching taps is an extremely troublesome procedure in which, to ensure safety, the tap is changed only after interrupting the AC voltage fed into the DC power supply 41, removing the cover of the power supply, discharging the residual charge of the condensers in the circuit, and confirming that discharge is complete While it is possible to switch taps by employing a switch external to the power supply device, this has the drawback of leading to a cost increase of the power supply device due to the added complexity and higher cost of its structure, particularly its insulation structure and contact structure.

A related document is Japanese Unexamined Patent Application, First Publication No. 2001-335928.

Accordingly, it is an object of the present invention to provide a sputtering apparatus that can supply a rated power to the sputtering load over a wide impedance range without using a transformer tap.

It is a further object of the present invention to provide a sputtering apparatus that automatically matches even large changes in the impedance of the sputtering load to supply the rated power.

It is yet another object of the present invention to provide a sputtering apparatus that can supply the rated power to a sputtering load whose impedance varies as widely as up to a fourfold range.

SUMMARY OF THE INVENTION

The sputtering apparatus of the present invention has a DC power supply, an inverter that converts the DC voltage from the DC power supply to AC voltage, a matching circuit that transforms the AC voltage from the inverter, a rectifier that converts the AC voltage transformed by the matching circuit to DC voltage, and a sputtering load to which is supplied the DC voltage obtained from the rectifier. The matching circuit has a transformer that transforms AC voltage from the inverter, inductance provided in series with the primary or secondary winding of the transformer, and a condenser provided in parallel between the inductance and the rectifier.

The turns ratio of the transformer's primary and secondary windings (number of secondary turns/number of primary tins) may be less than the ratio of the maximum rated voltage required for the sputtering load and the voltage of the DC power supply (maximum rated voltage/DC power supply voltage).

A power detection device for measuring the power supplied to the sputtering load is provided, and the inverter may be controlled by pulse width modulation (PWM) using the signal from the power detection device.

The inverter is a bridge inverter provided with two upper arm semiconductor switches and two lower arm semiconductor switches, each having an anti-parallel diode. Power supplied to the sputtering load may be regulated to the rated power by PWM control of each arm semiconductor switch based on the error signal between the power detected by the power detection device and the predetermined power.

The inverter may be a bridge inverter provided with two upper arm semiconductor switches and two lower arm semiconductor switches, each having an anti-parallel diode. Power supplied to the sputtering load may be regulated to the rated power by continuously applying an ON signal to either the upper arm semiconductor switches or lower arm semiconductor switches at a fixed pulse width (preferably the maximum pulse width of the PWM control) and applying to the other of the upper arm semiconductor switches or lower arm semiconductor switches an on signal controlled by PWM based on the error signal between the power detected by the power detection device and the predetermined power.

The transformer has a core and primary and secondary windings mutually separated from the core, and at least a portion of the inductance may be leakage inductance of the transformer.

The transformer core has a first leg and second leg, with the primary winding and secondary winding respectively split into two parts and wound around the first leg and second leg, and at least a portion of the inductance may be the leakage inductance of the transformer.

The power detection device may be provided with a voltage sensor that measures the voltage supplied to the sputtering load, a current sensor that measures the current supplied to the sputtering load, and a multiplier that multiplies the voltage value and current value detected by these sensors and outputs a power value.

At least a portion of the condenser may be the stray distributed capacity of the primary winding or secondary winding of the transformer.

A value of the inductance may be adopted in order to allow the rated maximum current to be supplied for the selected turns ratio and DC current.

A value of the condenser may be adopted in order to enable compensation for the voltage drop due to the set inductance and supply of the rated maximum voltage.

The present invention enables the continuous supply of constant power over the entire impedance range of a sputtering load changing over a wide range by the interaction of a transformer, inductance, and condenser.

DETAILED DESCRIPTION OF THE INVENTION

The embodiments of the sputtering apparatus according to the present invention are explained below with reference to the drawings. However, the present invention is not limited to the following embodiments, and various modifications are possible. For instance, conventionally widely known constitutions may be added, parts of constitutions of an embodiment may be mutually exchanged, and each constitution may be substituted for a conventionally widely know constitution.

Figure 1:
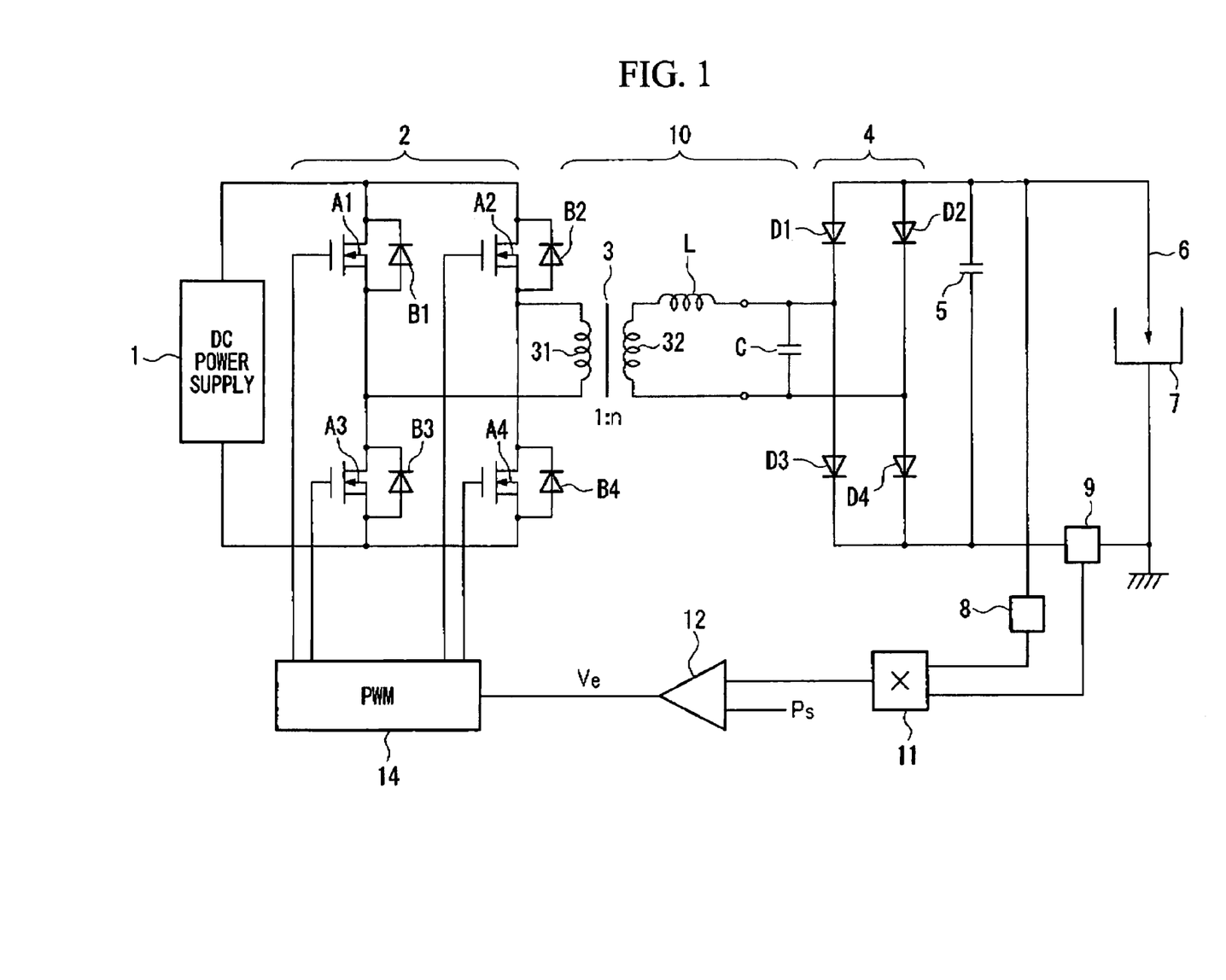
FIG. 1 is a circuit diagram showing the first embodiment of the present invention.

FIG. 1 shows the first embodiment of the present invention. DC power supply 1 is not restricted, but an example would be a three-phase rectifying circuit that rectifies a three-phase AC power supply and outputs a DC voltage smoothed by a choke coil and condenser. The DC voltage from DC power supply 1 is supplied to inverter 2, which in this example is a bridge-type high frequency inverter employing MOSFETs as four semiconductor switches A1 to A4. The inverter converts DC voltage to a high frequency AC voltage. Anti-parallel diodes B1 to B4 are connected in parallel to each of the semiconductor switches A1 to A4. However, MOSFET parasitic (internal) diodes may be employed when using MOSFETs as semiconductor switches A1 to A4, in which case anti-parallel diodes B1 to B4 are integrated with the MOSFETs. Other elements such as insulated gate bipolar transistors (IGBT) and bipolar transistors may also be used as semiconductor switches A1 to A4 besides the indicated MOSFETs. The high frequency AC voltage from inverter 2 is input to matching circuit 10, which has a transformer 3. The high frequency AC voltage is supplied to the primary winding 31 of the transformer 3 and is output as a suitable voltage from the secondary winding 32.

The turns ratio, n, of the primary winding 31 and secondary winding 32 (number of secondary turns/number of primary turns) is, as described later, selected based on the voltage of DC power supply 1 and the sputtering voltage. Transformer 3 in this example is a leakage transformer intentionally made to produce so-called leakage inductance between the primary winding 31 and secondary winding 32. Although the drawing shows inductance L isolated from the transformer 3, in this example, leakage inductance is utilized as inductance L. Accordingly, inductance L is not provided as a separate component but is integrated with the transformer 3. However, it is also possible to employ a low leakage transformer that generates hardly any leakage inductance between the primary winding 31 and secondary winding 32, and to place a coil in series with the secondary winding 32 as inductance L, or to lower the leakage inductance between the primary winding 31 and secondary winding 32 below the value of inductance L and to constitute a portion of the inductance L with a coil connected in series with the secondary winding.

Inductance L may be provided in series with the primary winding 31 of the transformer 3, in which case the required inductance when provided to the secondary winding divided by the square of the turns ratio, n, serves as a standard for the required inductance. Inductance L may also be provided in both the primary winding 31 and secondary winding 32 of transformer 3, in which case, condenser C to be described may be provided between inductance L and rectifier 4.

A center tap is not provided in secondary winding 32. Condenser C is connected in parallel with the secondary winding 32 through inductance L. Transformer 3, leakage inductance L and condenser C constitute through their interaction matching circuit 10 that can resonate over a wide range. Matching circuit 10 operates in a resonant mode particularly when the load impedance is high. The required capacity of condenser C in theory decreases as the switching frequency of the inverter increases, so the stray distributed capacity of the secondary winding 32 or primary winding 31 of the transformer 3 may be utilized as a portion or all of the condenser C.

The AC voltage generated at both ends of condenser C is input to the bridge rectifying circuit 4. The bridge rectifying circuit 4 of this example, which has four diodes D1 to D4, converts the transformed high frequency voltage to DC voltage. Filter condenser 5, which is connected in parallel with the bridge rectifying circuit 4, absorbs ripples from the rectified DC current. The capacity of filter condenser 5, which depends on the frequency of the high frequency voltage and sputtering current, is preferably 0.1 μF to 10 μF. However, it is not restricted to this range. The obtained DC voltage is supplied to sputtering load 6, which has a metal housing 7. The housing 7 is connected to the positive terminal of rectifier circuit 4 and is grounded.

Provided in this example are output voltage detection device 8 that measures the voltage supplied to the sputtering load 6, output current detection device 9 that measures the current flowing to the sputtering load 6, and multiplier circuit 11 that multiplies the voltage signal by the current signal to compute the power value. The output from multiplier circuit 11 is supplied to one of the inputs of the error amplifier 12, with the predetermined power signal Ps input to the other input of error amplifier 12. Error amplifier 12 compares these input signals and applies the error signal Ve corresponding to the difference of these input signals to a widely known pulse-width modulation (PWM) circuit 14.

PWM circuit 14 performs the PWM control of inverter 2 based on error signal Ve and feedback control to maintain power supplied to the sputtering load 6 at a constant level. In the case of the first and second examples of the upper arm of inverter 2 being MOSFET A1 and MOSFET A2, and the first and second examples of the lower arm of inverter 2 being MOSFET A3 and MOSFET A4, A1 and A4, and A2 and A3 are respectively driven by an in-phase signal, with each group (A1 and A4; A2 and A3) alternately switched on and off. For example, when the switching frequency of inverter 2 is 50 kHz, each group is alternately turned on every half cycle of 10 microseconds, with a rest time (dead time) of 1 microsecond. In this case, the on time of each group is in a range of 0 to 9 microseconds, and is controlled to correspond with error signal Ve. For example, when the output power supplied to sputtering load 6 is lower than the reference value and the voltage of error signal Ve is low, the on time is broadened to increase the power. Conversely, when the output power is higher than the reference value and the voltage of error signal Ve is high, the on time is narrowed to lower the voltage. In this way the output power is stabilized. The gate circuits of MOSFET A1 to A4 must be electrically insulated, although the insulation circuits are not shown in the drawings.

The relationship between voltage E (V) of DC current 1, turns ratio n of transformer 3, value $L_1$ of inductance L, and capacity $C_1$ of condenser C can be defined by an exact equation; however, is also possible to select constants by simulation and trial and error from values tagged as indicators by the following simple equations.

(1) Selection of Turns Ratio n

It is preferable for the turns ratio n to be less than the ratio m of the maximum rated voltage Vh (V) to the minimum DC voltage E (V) (Vh/E), that is, n<m=Vh/E. It is also preferable for n to be within a range of 50 to 90% of m. For example, if the minimum value of voltage E of DC power supply 1 is 250 V and the maximum rated voltage supplied to the sputtering load 6 is 1,000 V, m=4. When using a simple transformer, unless n=m=4, 1,000 V cannot be generated. However, in the present invention, a value of n less than 4 can be employed by transforming voltage in a resonant mode in the case of a particularly high impedance load. In the following embodiments, n=3 (75% of m) is employed, but it is not restricted to this value (2) Selection of Inductance L The value $L_1$ (H) of inductance L is equal to or less than the inductance value $L_0$ that can supply a maximum rated current Im (A) with a voltage E (V) of DC power supply 1, switching frequency f (Hz) and transformer with turns ratio n. The below equation may serve as a guide.

$$L_1 < L_0 = n \times E/8 \ (Im \times f)$$

For example, for a switching frequency of f=50 kHz and Im=20 A, $$L_1 < 3 \times 250/8(20 \times 50 \ k) = 93 \ \mu H$$

Accordingly, in the following embodiments, $L_1$=80 μH.

(3) Selection of Condenser C

Condenser C, via the resonance with inductance L, compensates for the insufficient voltage of the secondary winding due to selection of a turns ratio n less than the theoretically required turns ratio m for a high impedance load. The only standard for capacity $C_1$ of condenser C that has been analyzed is the condition that it be less than the capacity $C_0$ of the equation below that series resonates with inductance L selected as disclosed above. Upon further simulation and experimentation, the inventors selected capacity $C_1$.

$$C_0 = 1/(\omega^2 \times L)$$

In the condition for embodiments to be disclosed, $$C_0 = 1/(2 \times \pi \times f)^2 \times L = 1/((2 \times \pi \times 50 \ k)^2 \times 80 \ \mu) = 127 \ nF.$$

In the embodiments, the capacity $C_1$ of condenser C was set to 20 nF.

Table 1 shows combinations of value $L_1$ of inductance L and capacity $C_1$ of condenser C enabling attainment of 500 V×20 A and 1,000 V×10 A by changing the nuns ratio n to 2, 3, 4, 5 and 6 with a voltage of 250 V from DC power supply 1, inverter switching frequency of 50 kHz, and maximum pulse width of 9 microseconds (duty ratio of 0.9) as well as the simulation results of peak value $I_p$ of the inverter current in the respective loads. The result of simulating the output voltage during a load impedance of 100 kΩ is also presented as the trigger voltage due to the requirement of a trigger voltage of about 1.5 times the plasma discharge voltage in order to start the plasma discharge in sputtering.

TABLE 1

| Turns ratio n | $L_1$ (µH) | IpL (A) | $C_1$ (nF) | IpC (A) | Trigger voltage (V) |
|---|---|---|---|---|---|
| 1 | — | — | — | — | — |
| 2 | 60 | 80 | 60 | 90 | 1200 |
| 3 | 80 | 100 | 20 | 80 | 1700 |
| 4 | 120 | 150 | 6 | 60 | 2100 |
| 5 | 150 | 190 | 1 | 90 | 2100 |
| 6 | 180 | 200 | 0 | 120 | 1500 |

The simulation conditions are as follows:
 Voltage E of DC power supply 1=250 V
 F=50 kHz
 Maximum pulse modulation width (Tonmax)=9 µs
 During low impedance
  Load: 25 Ω, output 500 V×20 A, power: 10 kW
 During high impedance
  Load: 100 Ω, output 1,000 V×10 A, power-10 kW
 Impedance prior to plasma discharge: 100 kΩ

As shown in Table 1, for a turns ratio, n, of 2 or more, power was more or less obtained at every turns ratio. However, a turns ratio of 2 or 3 led to a small absolute value of the peak value $I_p$ of the inverter current in the high or low load impedance. That is, selection of inductance L and condenser C based on a turns ratio, n, of 2 or 3 enables the supply of the maximum rated power to a wide range of load impedances, while lowering the rated current needed for the transformer and semiconductor switching elements, improving efficiency and reducing the footprint of the device.

On the other hand, a turns ratio of 3 or more has the advantage of enabling generation of a high voltage equal to or exceeding the rated voltage during a light load such as when triggering discharge by means of the resonance of inductance L and condenser C.

When n=1, no combination of L and C was found that could output the rated voltage to any load impedance.

Figure 2:
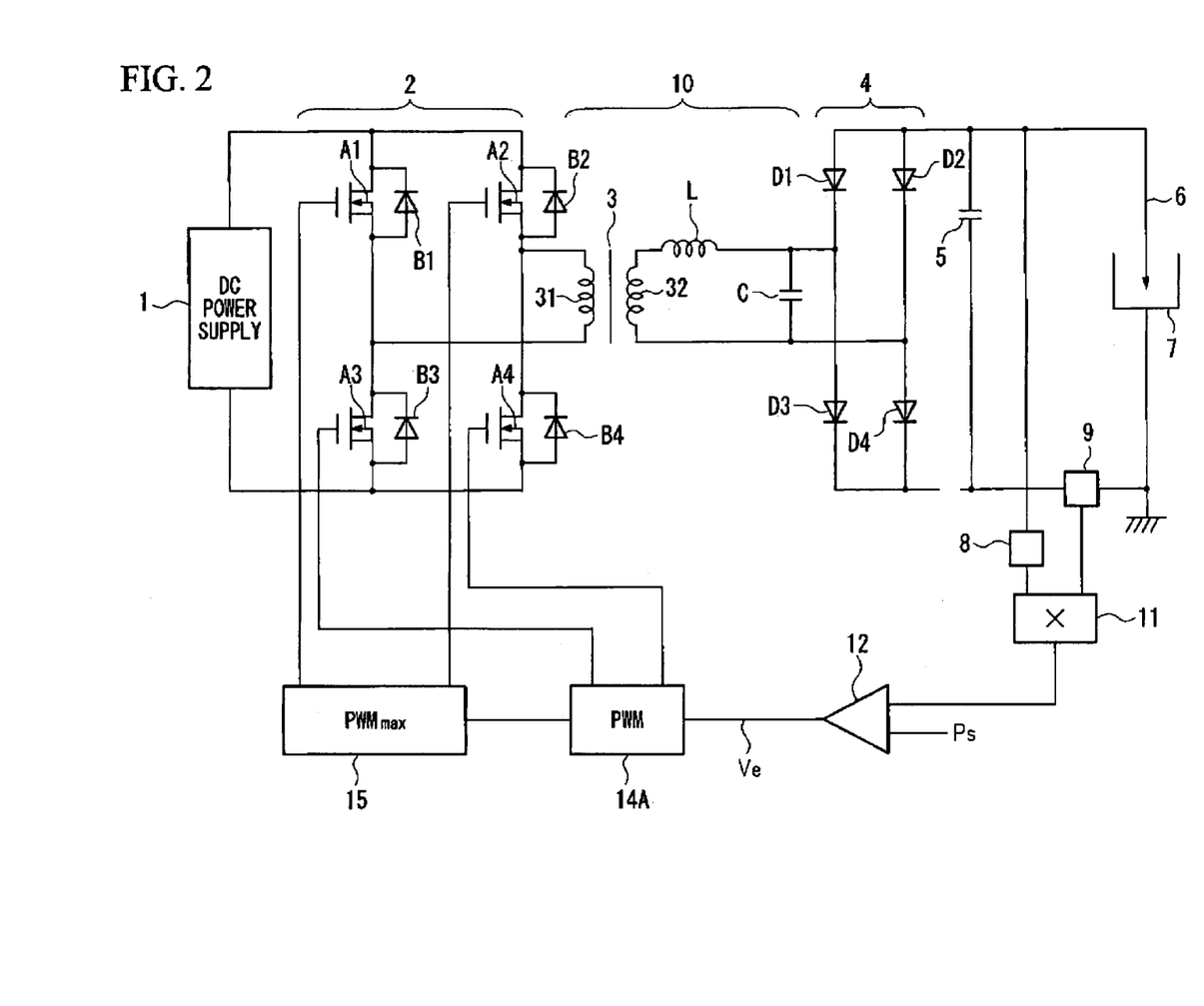
FIG. 2 is a circuit diagram showing the second embodiment of the present invention.

FIG. 2 shows the second embodiment of the present invention. Explanations are omitted for the reference numbers referring to the same locations as the first embodiment shown in FIG. 1. In the second embodiment, the method of controlling the upper arm semiconductor switches (MOSFETs in this example) A1 and A2 of inverter 2 have been changed. According to this constitution, fluctuation of the output voltage of DC power supply 1 causes less rippling of the output voltage supplied to sputtering load 6.

Normally, it is common to generate a DC power from commercial AC power. It is therefore necessary to take into account +/−10% fluctuations in commercial AC power, which causes fluctuations of +/−10% in the rectified DC power source voltage. For example, when the voltage E at −10% of the DC power supply 1 is 250 V, the maximum voltage is 300 V. When the power supply voltage rises, PWM circuit 14 of the embodiment of FIG. 1 regulates it to the rated voltage by commonly shortening the on time of all the switching elements A1 to A4. This leads to an increase in the ripples of the output voltage supplied to the sputtering load 6. A drawback of conventional PWM control is therefore that a shortening of the pulse width causes an increase in rippling due to the shortening of the output current supply time from the inverter.

In contrast, the embodiment shown in FIG. 2 differs in the method of controlling the lower and upper arms of inverter 2. The point of switches A1 and A4 and switches A2 and A3 being turned on simultaneously, with each group (A1 and A4, and A2 and A3) being alternately turned on is the same as the first embodiment. In addition, similarly to FIG. 1, PWM circuit 14A performs PWM control of the lower arm MOSFETs A3 and A4. That is, when the output power supplied to sputtering load 6 is lower than the reference value and the voltage of error signal Ve is low, the on time is broadened to raise the output power. Conversely, when the voltage of output signal Ve is high, the on time is reduced to lower the output power.

Figure 3:
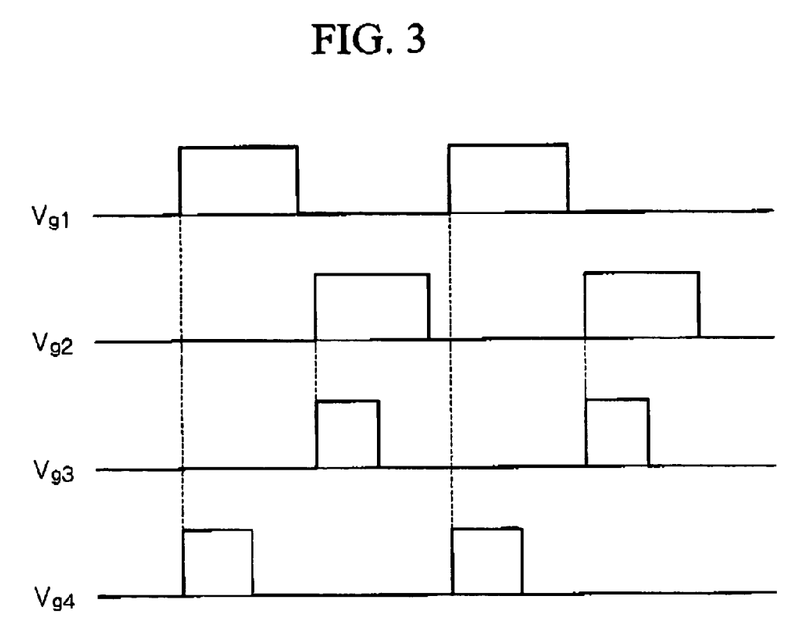
FIG. 3 is a graph showing the switching signal waveform in the second embodiment.

Meanwhile, PWM control is not performed for upper arm MOSFETs A1 and A2, which are continuously turned on by modulation circuit 15 for a fixed period of time at the maximum pulse width (such as 9 µs) during the lower arm PWM control. During this fixed time period the maximum pulse width is preferable, but control is still possible even if somewhat shorter. As a result, a rise in the power supply voltage shortens the pulse width of lower arms A3 and A4, while the upper arm pulse width remains steady. Consequently, after lower arm MOSFETs A3 and A4 turn off, corresponding upper arm MOSFETs A1 and A2 in phase are on at the maximum pulse width (such as 9 µs), so the output current supply time from inverter 2 becomes longer compared to the case of PWM control of all MOSFETs A1 to A4, thereby suppressing ripple increases. In particular, the MOSFET current peak value does not rise when the power supply voltage E increases. FIG. 3 is a timing chart showing gate signals Vg1, Vg2, Vg3 and Vg4 of MOSFETs A1 to A4 in this embodiment.

Figures 4A, 4B:
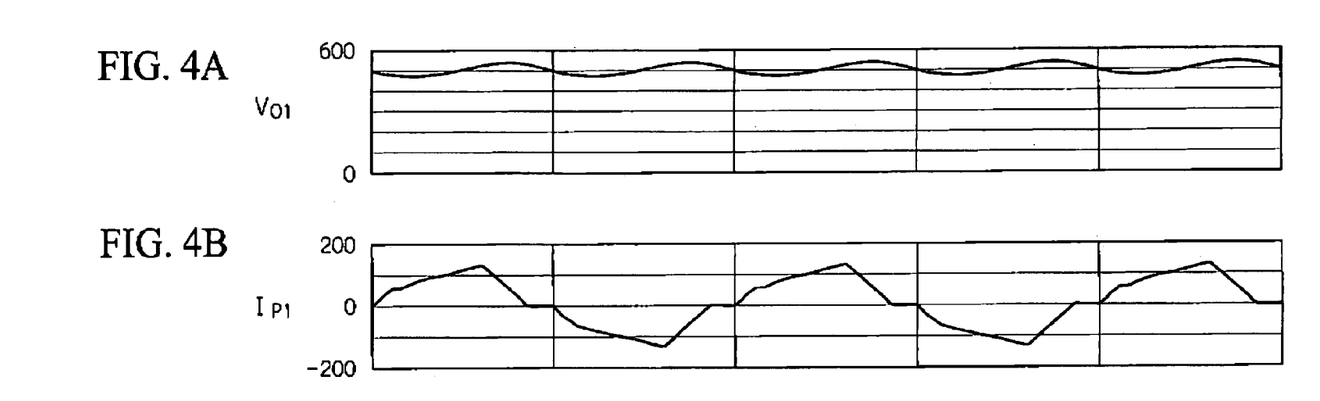
FIGS. 4A to 4D are graphs showing the output voltage waveforms and inverter current in the first embodiment and second embodiment of the present invention.
Figures 4C, 4D:
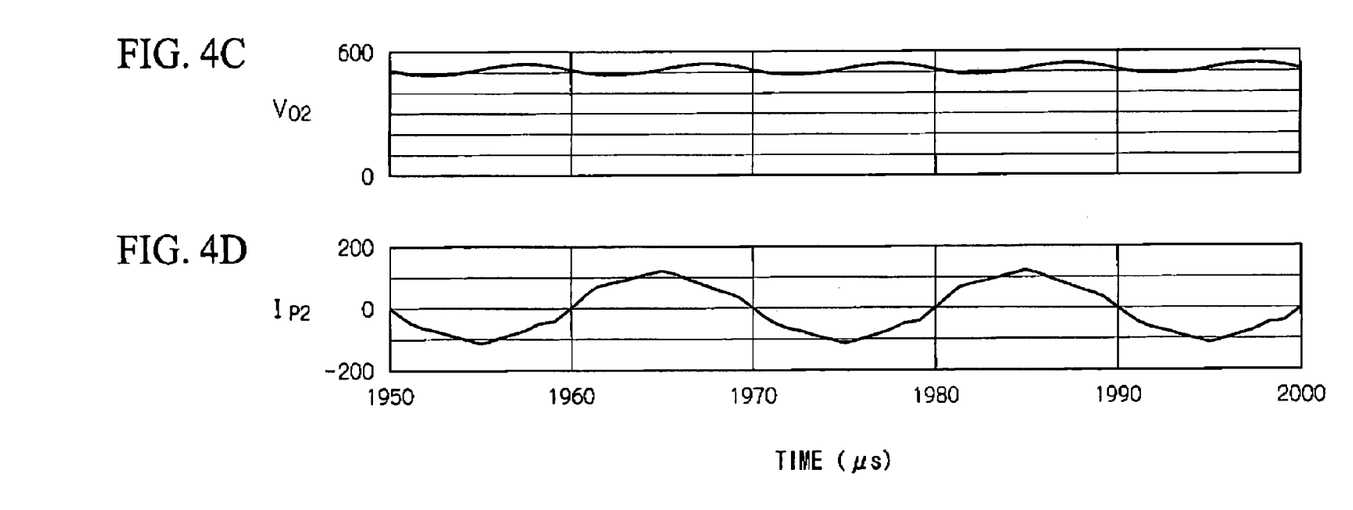

FIGS. 4A to 4D are graphs showing the waveforms of output voltage $V_0$ and inverter current Ip obtained under the conditions of a DC power supply voltage E of 300 V, and load impedance of 25 Ω by using 1 µF as filter conditioner 5, and transformer 3, inductance L, condenser C as per the previous example. FIGS. 4A and 4B show the result of the first embodiment shown in FIG. 1, while FIGS. 4C and 4D show the result of the second embodiment shown in FIG. 2.

In the first embodiment, the rated power is obtained when the pulse width of the PWM signal is 6 µs, with the waveforms of output voltage $V_{o1}$ and inverter current $I_{p1}$ shown in FIGS. 4A and 4B, respectively. In the second embodiment, the rated power is obtained when the pulse width of the PWM signal is 5 µs, with the waveforms of output voltage $V_{o2}$ and inverter current $I_{p2}$ shown in FIGS. 4C and 4D, respectively. Comparing FIGS. 4A to 4D, it is clear that a conduction stoppage period occurs in the first embodiment in which inverter current $I_{p1}$ is 0, causing comparatively large ripples in output voltage $V_{o1}$, while in the second embodiment the conduction period of $I_{p2}$ broadens and ripples of output voltage $V_{o2}$ decrease and the peak value of inverter current $I_{p2}$ falls.

Figure 5:
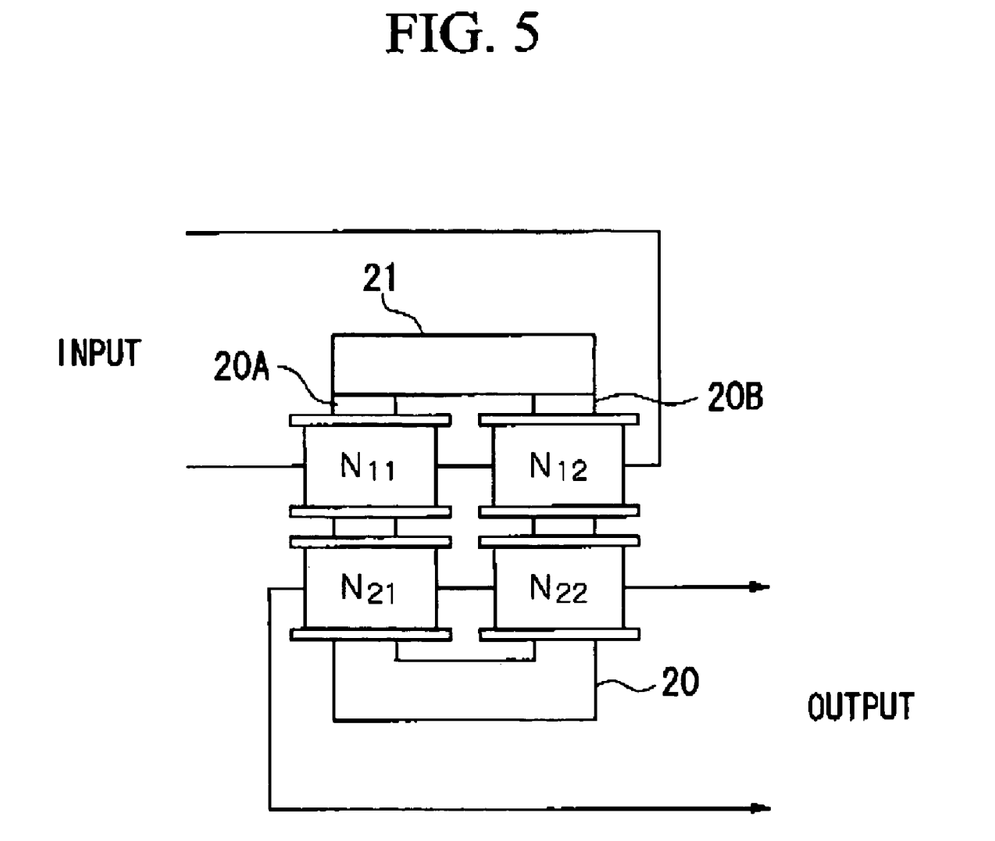
FIG. 5 is a front view showing an example of a transformer suitable for the present invention.

FIG. 5 shows a preferred example of transformer 3 that can be applied to any of the embodiments In this example, primary winding 31 and secondary winding 32 are not mounted to be concentrically overlapping. Also, primary winding 31 and the secondary winding are split into windings N11 and N12, and N21 and N22, respectively. The cores used in this example comprise U-core 20 and I-core 21. Windings N11 and N21 are mutually spaced on the first leg 20A of U-core 20, while windings N12 and N22 are mutually spaced on the second leg B. Windings N11 and N12, and N21 and N22 are respectively connected in series and with the same polarity.

The surface area of both the primary winding 31 and secondary winding 32 is increased with this type of construction, enhancing the heat dissipation effect and enabling suppression of temperature rise of the windings. The increased leakage inductance also makes it easy to form the secondary inductance L with only the leakage inductance, thereby eliminating the need to provide inductance L as a separate component from transformer 3.

Figure 6:
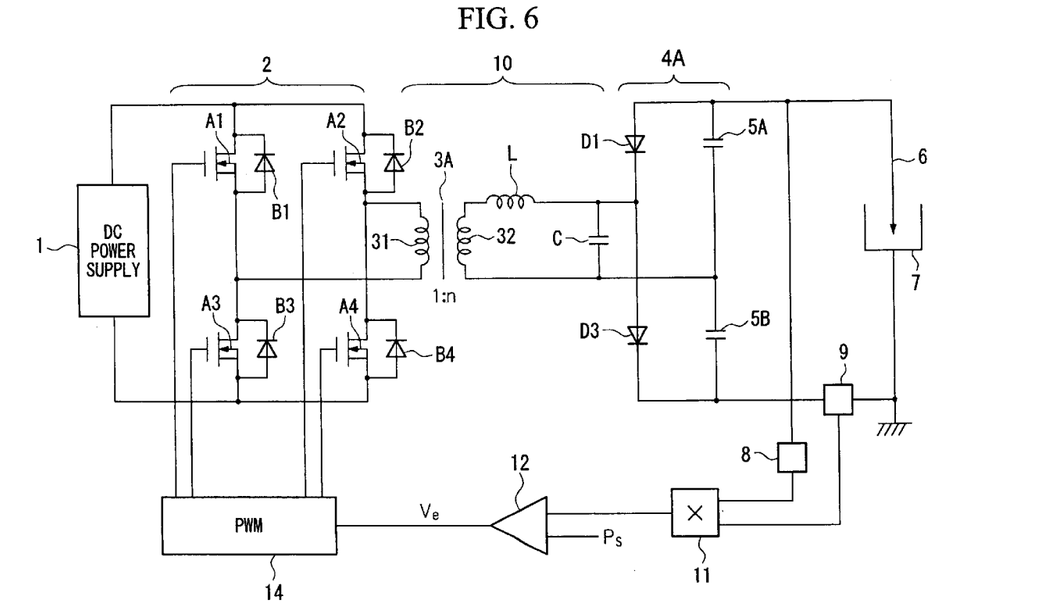
FIG. 6 is a circuit diagram showing the third embodiment of the present invention.

FIG. 6 shows the third embodiment of the present invention. Explanations are omitted for the reference numbers referring to the same locations as the first embodiment shown in FIG. 1. This example is characterized by use of double voltage rectification circuit 4A as a rectifier. Double voltage rectification circuit 4A has a pair of diodes D1 and D3 connected in reversed polarity to one output terminal of matching circuit 10 and a pair of condensers 5A and 5B connected to the other output terminal.

Use of double voltage rectification circuit 4A approximately doubles the output voltage supplied to the sputtering load 6 in comparison with the output voltage of matching circuit 10. Accordingly, it is preferable for the turns ratio n of transformer 3A to be less than half the ratio m of the maximum rated voltage Vh (V) to the num DC voltage E (V) (Vh/E) That is, it is preferable for n<m/2=Vb/2E. It is more preferable for n to be in a range of 50% to 90% of m/2. In the third embodiment, it is possible to alter inverter 2 similarly to the second embodiment.

As explained above, the sputtering apparatus of the present invention can constantly supply a virtually constant rated power to a load impedance that fluctuates over a wide range. Also, the ability to restrict the inverter current in a balanced manner over the full voltage range enables a reduction in switching loss and transformer winding loss.

What is claimed is:

1. A sputtering apparatus comprising:
a DC power supply;
an inverter that converts DC voltage from the DC power supply to AC voltage;
a matching circuit that transforms the AC voltage from the inverter;
a rectifier that converts the AC voltage transformed by the matching circuit to direct current; and
a sputtering load having an impedance that varies in a predetermined range, to which is supplied the DC voltage obtained from the rectifier,
wherein the matching circuit comprises: a transformer that transforms the AC voltage from the inverter; an inductance placed in series with at least one of a primary winding and a secondary winding of the transformer; and a condenser which is placed in parallel between the inductance and the rectifier and which is connected in parallel to the sputtering load via the rectifier.

2. A sputtering apparatus according to claim 1, wherein a turns ratio (number of secondary turns/number of primary turns) of the transformer is less than the ratio of a maximum rated voltage required for the sputtering load to the voltage of the DC power supply (the maximum rated voltage/the voltage of the DC power supply).

3. A sputtering apparatus according to claim 1, further comprising a power detection device which measures the power supplied to the sputtering load and performs pulse width modulation control of the inverter based on a signal from the power detection device.

4. A sputtering apparatus according to claim 3, wherein the inverter is a bridge inverter provided with two upper arm semiconductor switches and two lower arm semiconductor switches each having an anti-parallel diode, and power supplied to the sputtering load is regulated to the rated power by pulse width modulation control of each arm semiconductor switch based on an error signal between the power detected by the power detection device and a predetermined power.

5. A sputtering apparatus according to claim 3, wherein the inverter is a bridge inverter provided with two upper arm semiconductor switches and two lower arm semiconductor switches each having an anti-parallel diode, and power supplied to the sputtering load is regulated to the rated power by applying an on signal controlled by pulse width modulation based on an error signal between the power detected by the power detection device and a predetermined power.

6. A sputtering apparatus according to claim 1, wherein the transformer has a core and primary and secondary windings provided on the core while being separated from each other, and at least a portion of the inductance is a leakage inductance of the transformer.

7. A sputtering apparatus according to claim 1, wherein the transformer core has first and second legs, and primary and secondary windings each split into two parts and wound around the first leg and second leg, and at least a portion of the inductance is a leakage inductance of the transformer.

8. A sputtering apparatus according to claim 3, wherein the power detection device is provided with a voltage sensor that measures the voltage supplied to the sputtering load, a current sensor that measures the current supplied to the sputtering load, and a multiplier that multiplies the voltage value and current value detected by the voltage and current sensors and outputs a power value.

9. A sputtering apparatus according to claim 1, wherein a portion of the condenser is a stray distributed capacity of the secondary winding of the transformer.

10. A sputtering apparatus according to claim 1, wherein a turns ratio (number of secondary turns/number of primary turns) is less than the ratio of a maximum rated voltage required for the sputtering load to the voltage of the DC power supply (the maximum rated voltage/the voltage of the DC power supply); and
a voltage is transformed by using a resonance which is caused by the inductance and the condenser of the matching circuit in a case of a high impedance load.

11. A sputtering apparatus according to claim 10, wherein a trigger voltage which is higher than a highest rated voltage is applied.

12. A sputtering apparatus according to claim 1, wherein the rectifier is a double voltage rectification circuit and a turns ratio (number of secondary turns/number of primary turns) is less than half a ratio of the maximum rated voltage to the minimum DC voltage (the maximum rated voltage/(2×(the voltage of the DC power supply))).

13. A sputtering apparatus according to claim 2, wherein a value of the inductance is equal to or less than (n×E/8 (Im×f)) when a voltage of the DC power supply is E(V), n is the turns ratio (number of secondary turns/number of primary turns), Im is a maximum rated current of the DC power supply, and f is a switching frequency (Hz).

14. A sputtering apparatus according to claim 1, the predetermined range is a fourfold range.

* * * * *